(12) United States Patent
Boyd (10) Patent No.: US 7,205,074 B2
(45) Date of Patent: Apr. 17, 2007

(54) VENTING OF PELLICLE CAVITY FOR A MASK

(75) Inventor: Patrick D. Boyd, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 10/334,841

(22) Filed: Dec. 31, 2002

(65) Prior Publication Data

US 2004/0123950 A1 Jul. 1, 2004

(51) Int. Cl.
*G03F 9/00* (2006.01)
(52) U.S. Cl. .............................. 430/5; 355/75; 428/14
(58) Field of Classification Search ................... 430/5; 428/14; 355/75
See application file for complete search history.

(56) References Cited

U.S. PATENT DOCUMENTS

| 4,833,051 A | * | 5/1989 | Imamura | 430/5 |
|---|---|---|---|---|
| 6,103,427 A | * | 8/2000 | Storm | 430/5 |
| 6,558,855 B2 | * | 5/2003 | Tanaka et al. | 430/5 |
| 6,566,021 B2 | * | 5/2003 | Wang | 430/5 |
| 6,627,365 B1 | * | 9/2003 | Shiraishi | 430/30 |
| 6,841,317 B2 | * | 1/2005 | Wang | 430/5 |

OTHER PUBLICATIONS

RW Murphy et al., "*The Effect of Differentials on Pelliclized Photomasks*", Proceedings 14th Annual Symposium on Photomask Techology and Management, SPIE vol. 2322, Sep. 14, 1994, Santa Clara, CA, pp. 187-201.

* cited by examiner

*Primary Examiner*—Christopher G. Young
(74) *Attorney, Agent, or Firm*—George Chen (57) ABSTRACT

The present invention describes a method of providing a substrate, the substrate being transparent to radiation at an actinic wavelength; forming an absorber layer over the substrate, the absorber layer including an active area and a peripheral area; removing the absorber layer from a portion of the peripheral area; and forming a trench in the substrate in the portion of the peripheral area.

The present invention further describes a mask including an active area; and a peripheral area located around the active area, the peripheral area including vent channels.

19 Claims, 5 Drawing Sheets

VENTING OF PELLICLE CAVITY FOR A MASK

BACKGROUND OF THE INVENTION

1. Field of the Invention

The present invention relates to the field of semiconductor integrated circuit (IC) manufacturing, and more specifically, to a method of and an apparatus for venting a pellicle cavity of a mask.

2. Discussion of Related Art

The manufacturing of IC devices involves the formation and removal of various materials from a wafer. Photolithography is a process that uses exposure to radiation followed by developing to print a pattern from a mask in a photoresist coating on the wafer. A binary mask is a type of mask that only modulates the amplitude of the radiation. Etch is a process that transfers the pattern from the photoresist coating to the wafer. A layer may be considered critical if it includes a feature that is designed with a very small critical dimension (CD). Critical layers typically include the isolation, gate, contact, and first metal layers.

When the CD of the feature for a critical layer becomes smaller than the wavelength of the radiation, the resolution of the aerial image of the feature may be degraded by diffraction which is a spreading of the radiation. A phase-shifting mask (PSM) is a type of mask that modulates the phase as well as the amplitude of the radiation so as to minimize the detrimental effects of diffraction.

Optical proximity correction (OPC) may be incorporated into the design of a mask to compensate for systematic distortion of the image from print or etch. The distortions may include corner rounding, line shortening, and CD offset between isolated features and nested features.

A mask for a critical layer, such as a PSM with OPC, must be kept clean of environmental contamination in order to ensure fidelity of the pattern transfer. A mask may be kept clean by covering it with a pellicle mounted on a frame. However, a change in the ambient atmosphere may create a pressure differential between the inside and the outside of the pellicle cavity.

Thus, what is needed is a method of and an apparatus for venting a pellicle cavity of a mask.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of and an apparatus for venting a pellicle cavity of a mask. Various embodiments of a method of venting a pellicle cavity of a mask according to the present invention will be described first.

In an embodiment of the present invention, a mask may be formed from a mask blank 10. As shown in an embodiment of the present invention in FIG. 1, the mask blank 10 includes an absorber layer 1200 formed on a surface of a substrate 1100. In an embodiment of the present invention, the substrate 1100 is a flat, square plate with dimensions of about 152.4 millimeters (mm) by 152.4 mm and a thickness of about 6.35 mm with flatness of about 0.5–2.0 microns (um). The substrate 1100 should have a low coefficient of thermal expansion, a high modulus of elasticity, and no inclusion with a diameter of 1 um or greater.

Figure 1:
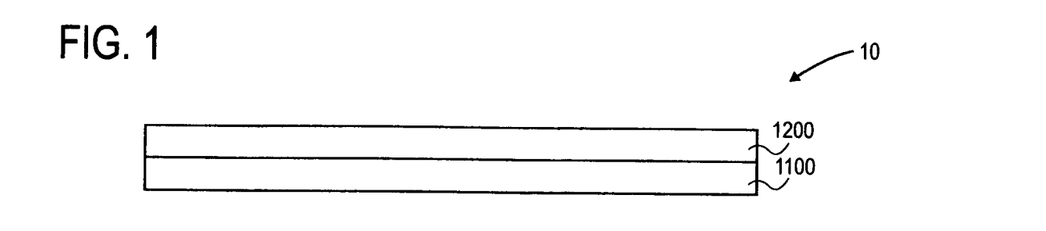
FIG. 1 is an illustration of an elevation view of an embodiment of a mask blank according to the present invention.

The substrate 1100 is transparent to radiation at an actinic wavelength. The actinic wavelength is the wavelength of radiation that will be incident on the mask in an imaging tool, such as a wafer stepper or a wafer scanner, to expose a radiation-sensitive material, such as a photoresist, on a wafer. When the actinic wavelength is about 436 nanometers (nm), 365 nm, 248 nm, or 193 nm, the substrate 1100 may be formed from fused silica with an index of refraction of about 1.40–1.60 at the actinic wavelength. Birefringence should be about 0.25–20 nm/cm. Birefringence is a measure of the difference in refractive index between two orthogonal axes.

However, when the actinic wavelength is about 157 nm, the substrate 1100 may be formed from modified fused silica or inorganic Fluoride. Modified fused silica includes low-Hydroxyl-content fused silica and Fluorine-doped fused silica. Inorganic Fluoride includes Calcium Fluoride ($CaF_2$) and Magnesium Fluoride ($MgF_2$).

The absorber layer 1200 is opaque to radiation at the actinic wavelength. The absorber layer 1200 has a thickness of about 60–180 nm with an optical density (OD) of about 2.5–4.0. The absorber layer 1200 may be thinner if it is formed out of a material with an imaginary extinction coefficient (k) that is larger.

The absorber layer 1200 may be formed from a metal, such as Chromium. Alternatively, the absorber layer 1200 may be formed from a refractory metal, such as Molybdenum, Tungsten, or a related alloy or ceramic. Other materials, such as amorphous Carbon or amorphous Silicon, may also be used.

The absorber layer 1200 may have a graded structure, which varies in composition through its thickness, or a stacked structure, which includes multiple layers. At an upper surface of the absorber layer 1200, it may be desirable to reduce reflectivity, such as to below 10% of the amplitude of the incident radiation at the actinic wavelength, so as to minimize flare, or scattered light, during exposure to radiation in the imaging tool. At a lower surface of the absorber layer 1200, it may be desirable to improve adhesion to the substrate 1100. In an embodiment of the present invention, the absorber layer 1200 may include Chromium Oxynitride towards the upper surface, Chromium around the middle section, and Chromium Oxide towards the lower surface.

Figure 2A:
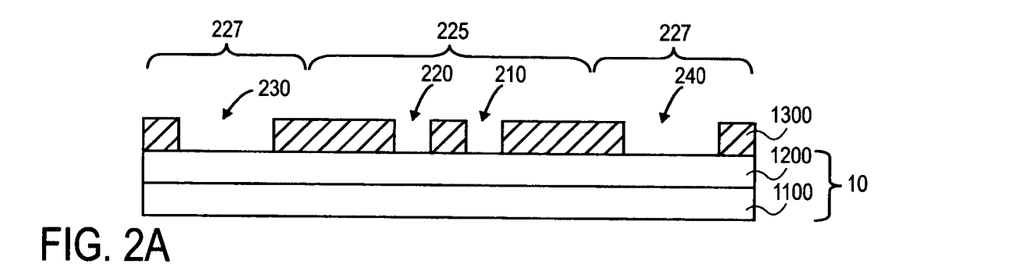
FIG. 2A–2C is an illustration of an elevation view of a method of forming an embodiment of a binary mask according to the present invention.

As shown in an embodiment of the present invention in FIG. 2A, a first-level photoresist 1300 is applied over the absorber layer 1200 on the mask blank 10. The first-level photoresist 1300 may have a thickness of about 160–640 nm. The first-level photoresist 1300 is usually exposed with electrons. An electron beam pattern generator, or e-beam writer, that uses a raster scan with an acceleration voltage of 10–20 kiloelectron Volts (keV) may be used to expose the first-level photoresist 1300.

If it is desired to achieve a finer resolution and a higher pattern fidelity, an e-beam writer that uses a vector scan with an acceleration voltage of 40–50 keV may be used. However, fewer electrons are absorbed in the photoresist due to the higher acceleration voltage. Consequently, a chemically-amplified resist (CAR) with a high sensitivity to radiation at the actinic wavelength should be used with the higher acceleration voltage to reduce beam heating and increase throughput.

After exposure by e-beam, the first-level photoresist 1300 is developed to produce some openings 210, 220 in an active area 225 of the mask and other openings 230, 240 in a peripheral area 227 of the mask. The first-level photoresist 1300 should have high resolution and good linearity for the critical dimension (CD).

Figure 2B:
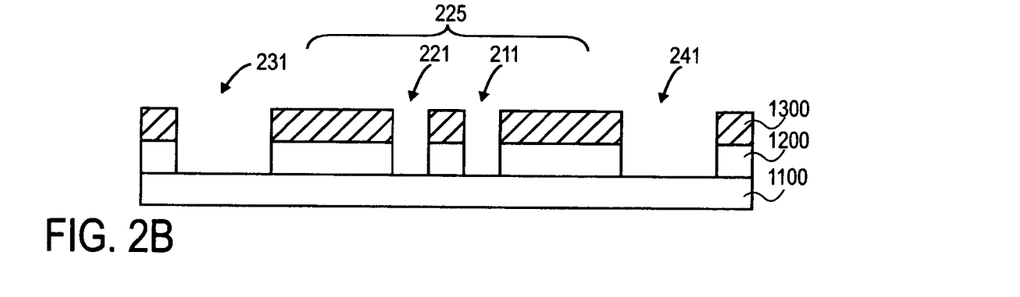

The first-level photoresist 1300 should also have good dry etch resistance to allow pattern transfer by reactive ion etch (RIE) to the absorber layer 1200 located below, as shown in an embodiment of the present invention in FIG. 2B.

The etch of the absorber layer 1200 may be performed in a parallel plate reactor with a high plasma density and a low gas pressure. The RIE may include a Chlorine-based chemistry, such as $Cl_2/O_2$ or $BCl_3$. In certain cases, it may be advantageous to add an assist gas, such as $H_2$ or HCl, since Hydrogen radicals can scavenge excess Chlorine radicals. If desired, an in-situ descum process, such as with Oxygen, to remove residue that may be present in the openings 210, 220, 230, 240 in the first-level photoresist 1300 may be done prior to performing the RIE.

Loading effects in the RIE may affect etch rates, etch uniformity, and etch selectivity. It is desirable to increase etch selectivity so as to minimize erosion of the first-level photoresist 1300. Sidewall passivation can help control the etch profile and the etch bias. Helium may be added to increase plasma density, reduce direct current (DC) bias, and increase the etch selectivity of the absorber layer 1200 over the substrate 1100 and the first-level photoresist 1300. The etch of the absorber layer 1200 should be predominantly anisotropic to produce nearly vertical profiles in the sidewall of the etched openings 211, 221, 231, 241, as shown in an embodiment of the present invention in FIG. 2B.

Figure 2C:
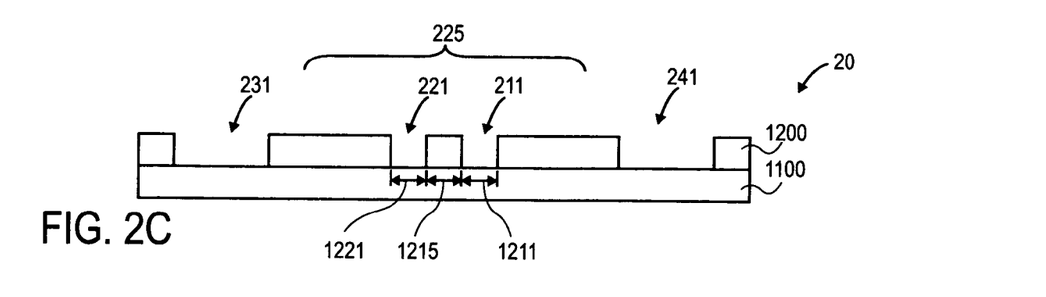

As shown in an embodiment of the present invention in FIG. 2C, removal of the first-level photoresist 1300 will produce a binary (non-phase-shifting) mask 20 with the active area 225, in which a space 1215 separates a first etched opening 211, with a width 1211, from a second etched opening 221, with a width 1221. The width of an etched opening and the space between two etched openings may be measured with a Scanning Electron Microscope (SEM).

The etched openings 211, 221, 231, and 241 may also be inspected for defects. Defect inspection may be based on a comparison of two nominally identical patterns printed in different portions of the mask (die-to-die) or based on a comparison of a pattern printed on the mask and the layout data corresponding to the pattern (die-to-database). A focused ion beam (FIB) tool may be used to repair an opaque defect using physical ion sputtering or gas-assisted etch (GAE).

Improvements in photolithography have increased density and enhanced performance of integrated circuits (ICs) by shrinking devices in the ICs. As described by Rayleigh's criterion, the minimum CD that can be resolved by an imaging tool is directly proportional to the wavelength of the illumination source of the imaging tool and inversely proportional to the numerical aperture (NA) of the projection lens of the imaging tool. However, diffraction tends to degrade an aerial image when the CD becomes smaller than the actinic wavelength. As needed, a resolution enhancement technique (RET), such as a phase-shifting mask (PSM), may be used to achieve a wider process latitude. Unlike a binary mask 20 that only uses an absorber layer 1200 to modulate the amplitude of radiation transmitted through a substrate 1100, a PSM further modulates the phase of radiation to take advantage of destructive interference to compensate for the detrimental effects of diffraction.

Figure 3A:
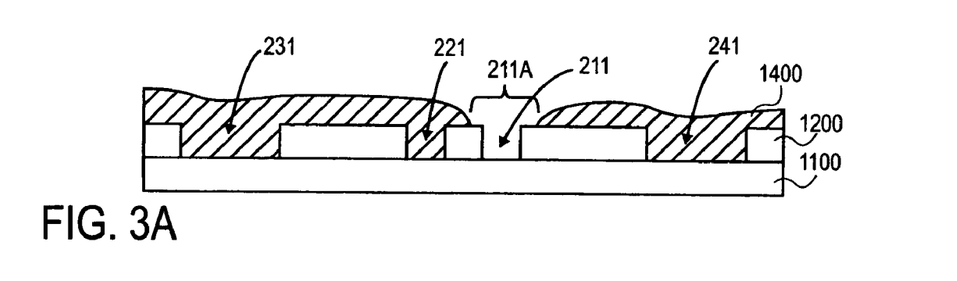
FIG. 3A–3C is an illustration of an elevation view of a method of forming an embodiment of an alternating phase-shifting mask according to the present invention.
Figures 3B, 3C:
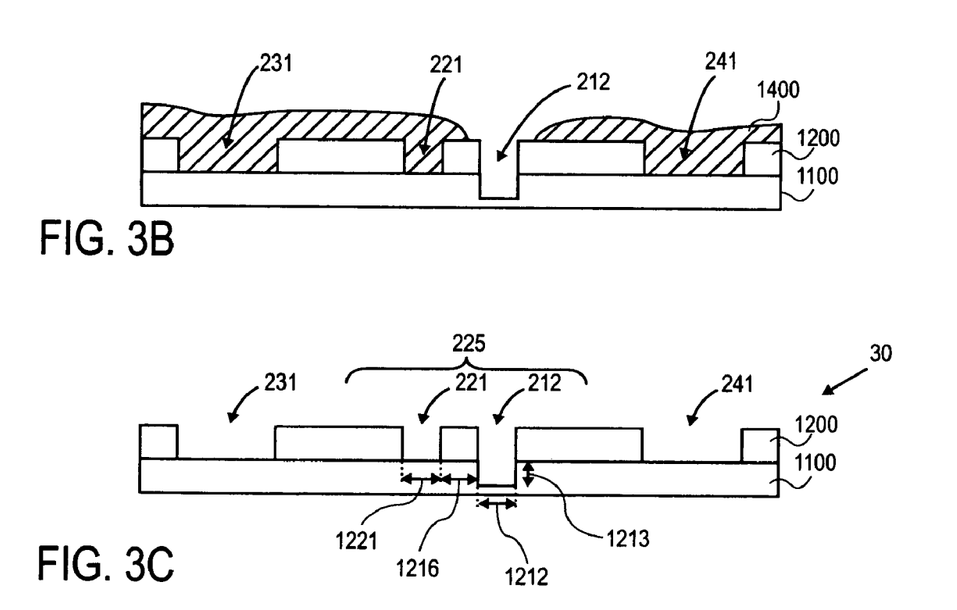

FIG. 3C shows an embodiment of an Alternating PSM (AltPSM) 30. The AltPSM 30 is a type of PSM that is particularly helpful in improving contrast when patterning a very small CD, such as the gate length of a transistor in an IC device. The AltPSM 30 introduces a phase shift of 180 degrees between the radiation transmitted through two adjacent etched openings 212, 221 in an opaque absorber layer 1200 so destructive interference can force the amplitude between the two corresponding images to zero.

A phase shift may be implemented by creating a difference in the optical path lengths through the two adjacent etched openings 212, 221. The difference in the optical path lengths may be created by an additive process or a subtractive process.

An additive process (not shown) may be used to introduce the phase shift. In an additive process, a layer that is transparent to radiation at the actinic wavelength, such as a spin-on-glass (SOG), is deposited through openings in the absorber layer onto the substrate, such as fused silica or quartz, followed by removal of the transparent layer in alternate openings. However, an additive process is susceptible to an optical mismatch of the transparent materials in the light path, resulting in internal losses at interfaces.

Thus, a subtractive process is usually used to introduce the phase shift. After the first-level photoresist 1300 is stripped, a second-level photoresist 1400 is applied, as shown in an embodiment in FIG. 3A. The second-level photoresist 1400 may have a thickness of about 300–600 nm.

The second-level photoresist 1400 is usually an optical photoresist which is exposed with a laser pattern generator, or laser writer, that uses a raster scan with multiple beams of deep ultraviolet (DUV) light. Laser written features are susceptible to corner rounding and CD non-linearity so laser proximity correction is usually incorporated to improve pattern fidelity. Laser writing is typically performed with multiple passes to average out subsystem errors that may otherwise adversely affect stripe butting, placement linearity, edge roughness, and CD uniformity.

As shown in an embodiment of the present invention in FIG. 3A, the second-level photoresist 1400 covers up the non-phase-shifting etched opening 221 and forms a blockout opening 211A over the phase-shifting etched opening 211 that is biased larger so as to accommodate registration errors, CD errors, and overlay tolerances in photolithography and etch. Thus, the placement of the larger blockout opening 211A in the second-level photoresist 1400 over the phase-shifting etched opening 211 in the absorber layer 1200 is not very critical.

After the second-level photoresist 1400 is exposed and developed, a RIE is performed to etch the substrate 1100 below the phase-shifting etched opening 211. The RIE may include a Fluorine-based chemistry, such as $CHF_3$, or $CF_4/He/O_2$, or $SF_6/He$. The RIE may be done in a high-pressure Inductively Coupled Plasma (ICP) system or a Magnetically Enhanced Reactive Ion Etching (MERIE) system.

If desired, a voting technique may be used to create a phase shift of 180 degrees between the two adjacent etched openings 211, 221 in the absorber layer 1200. Voting involves performing a process in several small steps instead of in one large step so that any spatial or temporal non-uniformity in the process may be smoothed out. In one embodiment of the present invention, a triple-voting technique may be used to perform three short etches into the substrate 1100, each of which produces a phase shift of about 60 degrees. Voting significantly improves control of the depth of the trench being etched into the substrate 1100, and thus the phase shift, by reducing the impact of any extraneous contamination that may otherwise block the etch.

Each of the three short etches is preceded by application, exposure, and developing of the blockout opening 211A in the second-level photoresist 1400 over the phase-shifting etched opening 211. The second-level photoresist 1400 is stripped after each of the three short etches so the phase shift and the amplitude (intensity) of radiation at the actinic wavelength may be measured. The etch times may be adjusted as needed based on feedback from the measurements. It is desirable for the phase shift to have a range of less than 1.0 degree and the amplitude to have a range of less than 0.2%.

After stripping the second-level photoresist 1400 for the last time (third time if using a triple-voting technique), as shown in an embodiment of the present invention in FIG. 3C, a plasma process may be used to clean up the AltPSM 30 and remove any residual film or defect that may be present in the etched openings 212, 221, 231, 241. A shorter or less aggressive version of an isotropic wet etch may also be used to remove defects.

FIG. 3C shows the AltPSM 30 in an embodiment of the present invention in which a space 1216 separates the phase-shifting etched opening 212, with a width 1212, from the non-phase-shifting etched opening 221, with a width 1221. The etch of the phase-shifting opening 212 creates a recess or a trench with a depth 1213 in the substrate 1100 that corresponds to a phase shift of 180 degrees in the radiation that will be transmitted through the phase-shifting etched opening 212 relative to the radiation that will be transmitted through the non-phase-shifting etched opening 221.

In an embodiment of the present invention, the sidewall of the phase-shifting etched opening 212 is steep and smooth, with a slope of about 85–90 degrees, and the bottom of the phase-shifting opening 212 is flat and smooth. Non-uniformities in the shape and dimensions of the trench in the substrate 1100 will introduce errors in the phase and the amplitude of the radiation at the actinic wavelength that is transmitted through the AltPSM 30 and may reduce the depth of focus (DOF) for isolated features.

The profile of the sidewall and the bottom of the phase-shifting etched opening 212 may be measured with an Atomic Force Microscope (AFM). The trench depth 1213 in the substrate 1100 may be determined by subtracting the thickness of the absorber layer 1200 from the overall step height that was measured by the AFM.

Figure 4A:
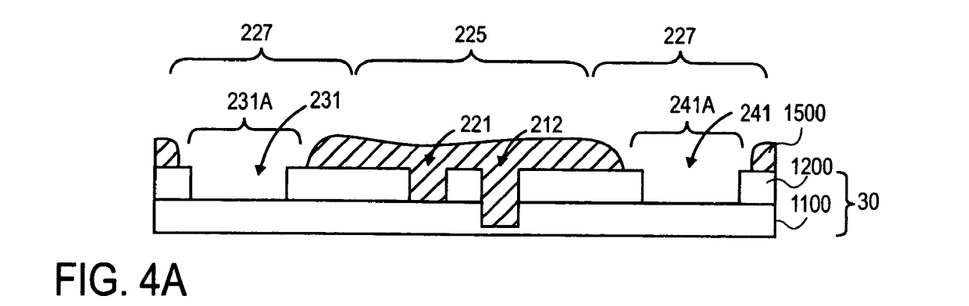
FIG. 4A–4C is an illustration of an elevation view of a method of forming an embodiment of vent channels in an alternating phase-shifting mask according to the present invention.

Next, as shown in an embodiment of the present invention in FIG. 4A, a third-level photoresist 1500 is applied. The third-level photoresist 1500 may have a thickness of about 900–1,800 nm.

The third-level photoresist 1500 is an optical photoresist which is exposed with a laser writer that uses a raster scan with multiple beams of DUV light. Laser written features are susceptible to corner rounding and CD non-linearity so laser proximity correction is usually incorporated to improve pattern fidelity. Laser writing is typically performed with multiple passes to average out subsystem errors that may otherwise adversely affect stripe butting, placement linearity, edge roughness, and CD uniformity.

In an embodiment of the present invention, the third-level photoresist 1500 may be exposed by a contact printer, a projection printer, or a wafer stepper, especially when the etched openings 231, 241 in the absorber layer 1200 are large and do not require the use of an e-beam writer or a laser writer.

As shown in an embodiment of the present invention in FIG. 4A, the third-level photoresist 1500 covers up the active area 225 of the AltPSM 30 and includes openings 231A, 241A over the respective etched openings 231, 241 in the peripheral area 227 of the AltPSM 30. The blockout openings 231A, 241A are biased larger so as to accommodate registration errors, CD errors, and overlay tolerances in photolithography and etch. Thus, the placement of the larger blockout openings 231A, 241A in the third-level photoresist 1500 over the respective etched openings 231, 241 in the peripheral area 227 of the AltPSM 30 is not very critical.

Figure 4B:
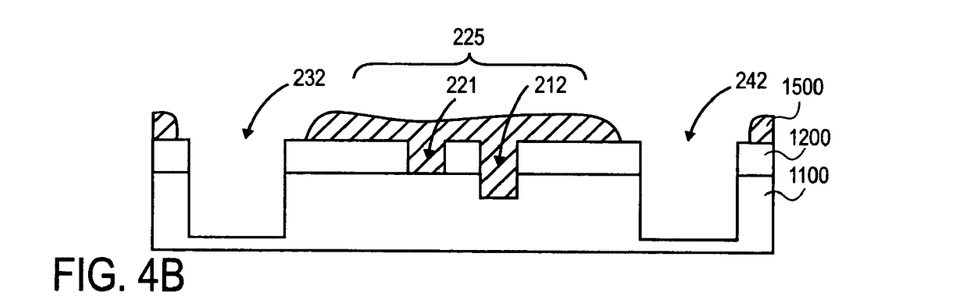

After the third-level photoresist 1500 is exposed and developed, the vent channels 232, 242 are etched in the substrate 1100, as shown in an embodiment of the present invention in FIG. 4B. The etch may include a RIE performed with a Fluorine-based chemistry, such as $CHF_3$, or $CF_4/He/O_2$, or $SF_6/He$. The etch may be done in a high-pressure ICP system or a MERIE system.

In an embodiment of the present invention, the vent channels 232, 242 may be formed by ion milling. In another embodiment of the present invention, the vent channels 232, 242 may be formed by wet etch.

Figure 4C:
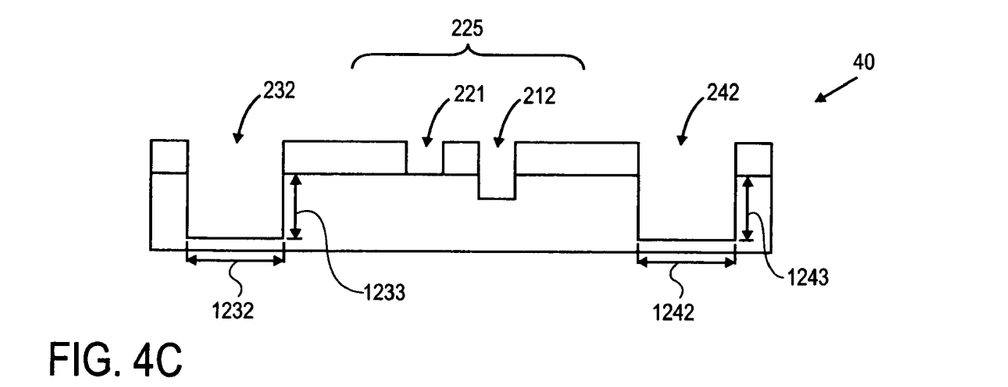

After stripping the third-level photoresist 1500, as shown in an embodiment of the present invention in FIG. 4C, a plasma process may be used to clean up the vented AltPSM 40 and remove any residual film or defect that may be present in the vent channels 232, 242. A shorter or less aggressive version of an isotropic wet etch may also be used to remove defects.

FIG. 4C shows the vented AltPSM 40 in an embodiment of the present invention. In an embodiment of the present invention, the sidewall of the vent channels 232, 242 is steep and smooth, with a slope of about 85–90 degrees, and the bottom of the vent channels 232, 242 is flat and smooth. In another embodiment of the present invention (not shown), the vent channels 232, 242 may include rounded bottoms, such as "U"-shaped cross-section, or notched bottoms, such as "V"-shaped cross-section, along the trench lengths 1232, 1242 or the trench widths.

The profile of the sidewall and the bottom of the vent channels 232, 242, as well as the trench lengths 1232, 1242 and the trench widths (oriented perpendicular to the plane of the cross-section shown in FIG. 4C) may be measured with an AFM. The trench depths 1233, 1243 in the substrate 1100 may be determined by subtracting the thickness of the absorber layer 1200 from the overall step height measured.

In an embodiment of the present invention, the trench depths 1233, 1243 are about 0.25–3 times the trench width. In another embodiment of the present invention, the vent channels 232, 242 may have a trench depth of about 500–1,500 um.

Figure 6:
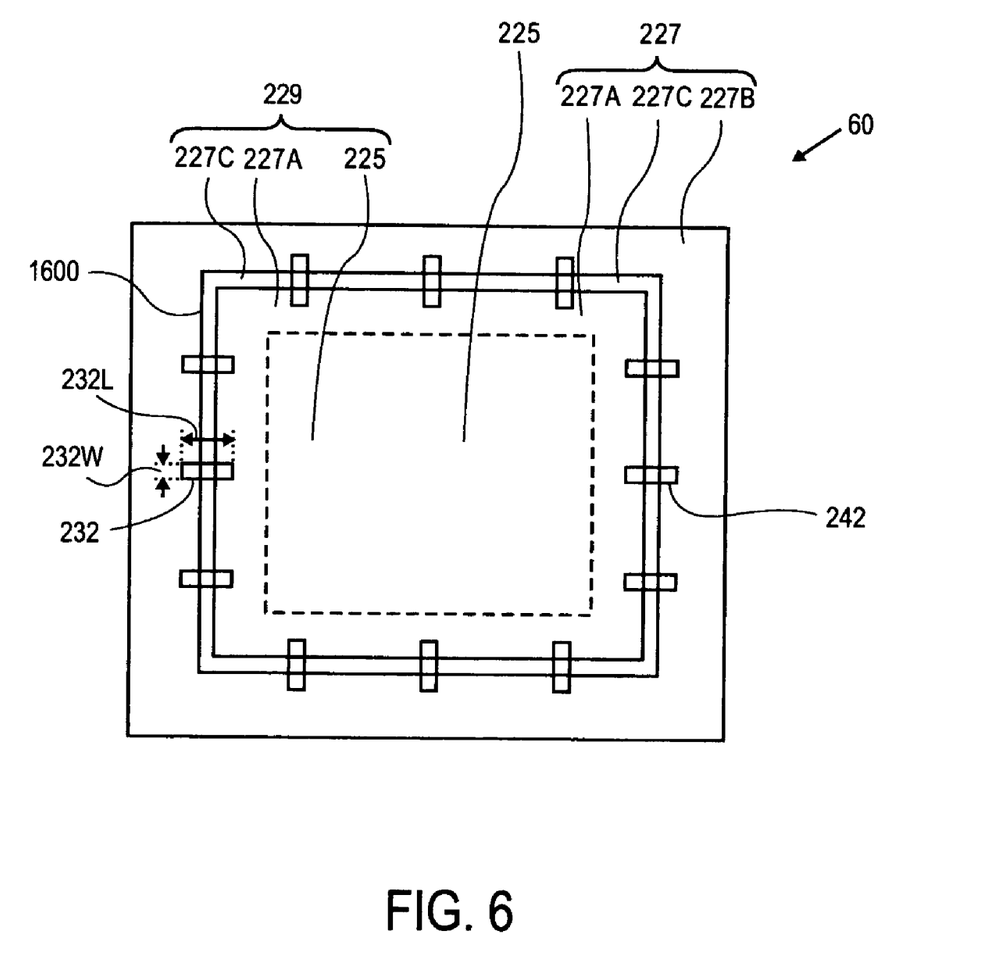
FIG. 6 is an illustration of a plane view of an embodiment of an alternating phase-shifting mask with vent channels according to the present invention.

As shown in a plane view of an embodiment of the present invention in FIG. 6, the vent channel 232 may include a trench or a groove with a width 232W of about 500–2,000 um and a length 232L of about 2,500–6,000 um. In another embodiment of the present invention, the vent channels 232, 242 may include curves, such as "S"-shapes, or zig-zags, such as "Z"-shapes, along their lengths.

Figure 5A:
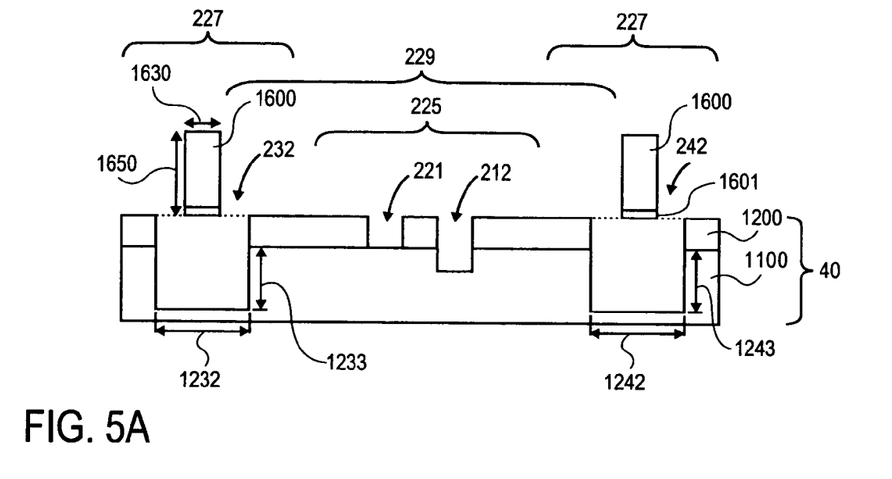
FIG. 5A–5B is an illustration of an elevation view of a method of forming an embodiment of a frame and a pellicle on a vented alternating phase-shifting mask according to the present invention.

As shown in an elevation view of an embodiment of the present invention in FIG. 5A, a frame 1600 may be mounted with a frame adhesive 1601 to a front surface of the vented AltPSM 40. Except where the frame 1600 traverses the vent channels 232, 242, the frame adhesive 1601 covers a minimum of about 70% of the width 1630 of the frame 1600.

The frame 1600 straddles the vent channels 232, 242 in the peripheral area 227 of the vented AltPSM 40. The vent channels 232,242 are sufficiently wide, deep, and long so that the frame adhesive 1601 will not completely fill in the vent channels 232, 242 wherever the frame 1600 traverses over the vent channels 232, 242.

The frame adhesive 1601 may be a paste or a hot melt adhesive. The frame adhesive 1601 is resistant to radiation at the actinic wavelength and will not outgas or generate particles even when temperature becomes elevated during exposure to the radiation in an imaging tool.

The frame 1600 may be formed from metal, ceramic, or plastic. In one embodiment of the present invention, the frame 1600 is formed from a rigid material with good thermal conductivity. In an embodiment of the present invention, the frame 1600 may be formed from 7075 high strength aircraft aluminum alloy that has been anodized black per Mil-A-8625 Type II, class 2 by electrolysis. The frame 1600 has a height 1650 (above the surface of the vented AltPSM 40) of about 2–6 mm and a width 1630 (across the surface of the AltPSM 40) of about 2 mm.

The frame 1600 encloses the active area 225 of the vented AltPSM 40 within a frame area 229 that will later be located in a pellicle cavity 1620. In an embodiment of the present invention, the frame area 229 has a shape that may include curved sides, truncated sides, truncated corners, or straight sides. In another embodiment of the present invention, the frame area 229 has a shape that is essentially circular, polygonal, octagonal, square, rectangular, or oval. In still another embodiment of the present invention, the frame area 229 has a shape that is a rectangle with a length of about 147–149 mm and a width of about 113–124 mm.

In the case of a transmissive mask, such as for deep-ultraviolet (DUV) lithography, a pellicle 1700 may be mounted to the frame 1600 on the front surface (absorber layer 1200 side) of the vented AltPSM 40 while another pellicle (not shown) may be mounted to another frame (not shown) on the back surface of the vented AltPSM 40. In the case of a reflective mask, such as for extreme ultraviolet (EUV) lithography, a pellicle 1700 is only mounted on the front surface (reflective side) of the reflective mask.

The pellicle 1700 is formed from a material that has a high transmittance of radiation at the actinic wavelength. A transmittance of about 98% or greater is desirable, but, for certain actinic wavelength, such as 157 nm, a transmittance as low as about 80% may be adequate. The pellicle 1700 should have minimal absorption and minimal reflectance of radiation at the actinic wavelength. In an embodiment of the present invention, such as for an actinic wavelength of 436 nm or 365 nm, the pellicle 1700 may be coated with one or more layers of an anti-reflective coating (ARC) on one or both surfaces. The pellicle 1700 should not degrade even after repeated exposure to radiation at the actinic wavelength.

A pellicle 1700 that is soft may be used at an actinic wavelength, such as 436 nm, 365 nm, 248 nm, or 193 nm. In one embodiment of the present invention, the pellicle 1700 is a thin membrane or film that is stretched across the frame 1600. Suitable materials for forming the pellicle 1700 may include nitrocellulose or cellulose acetate for actinic wavelength of 436 nm or 365 nm, fluorocarbon polymer for actinic wavelength of 248 nm, and perfluorocarbon polymer for actinic wavelength of 193 nm. The pellicle 1700 may have a thickness of about 0.5–3.0 um with flatness of 1 um or less. In an embodiment of the present invention, the pellicle 1700 has a thickness of (0.7–0.8) +/−0.05 um.

A pellicle 1700 that is hard may be used for certain actinic wavelength, such as 157 nm. In one embodiment of the present invention, the pellicle 1700 is a thin layer that is supported by the frame 1600. Suitable materials for forming the pellicle 1700 may include modified fused silica. Modified fused silica includes low-Hydroxyl-content fused silica and Fluorine-doped fused silica. The pellicle 1700 may have a thickness of about 500–1,100 um.

Figure 5B:
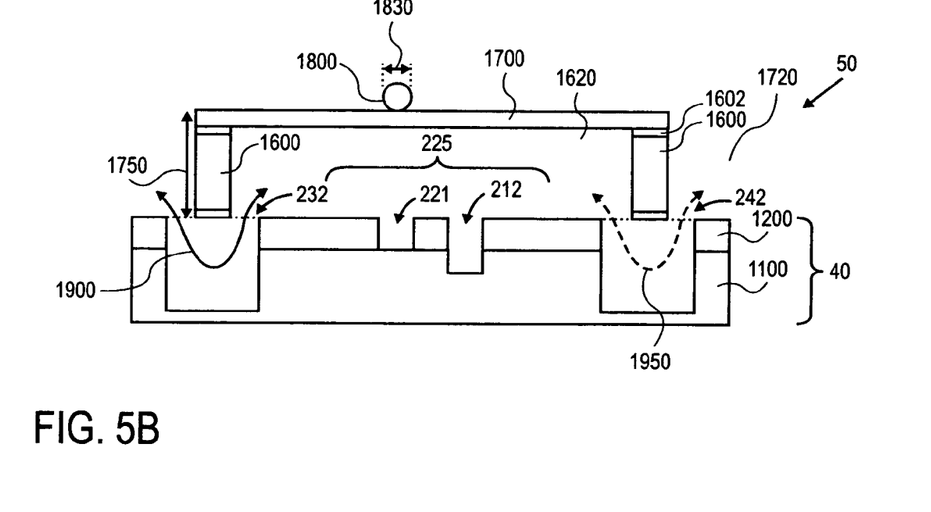

Next, as shown in an embodiment of the present invention in FIGS. 5A–5B, the pellicle 1700 is attached to the frame 1600 to form a pellicle cavity 1620 that includes the frame area 229 enclosing the active area 225 on the vented AltPSM 40. The pellicle 1700 has a standoff distance 1750 above the surface of the active area 225 of the vented AltPSM mask 40 that depends on the height 1650 of the frame 1600. The standoff distance 1750 should be larger than the depth of focus for the exposure so that any contamination 1800 that may land on the pellicle 1700 will not print as a defect, as long as the lateral dimension 1830 of the contamination 1800 is smaller than a threshold dimension, such as 0.1 um.

The pellicle 1700 may be attached to the frame 1600 with a pellicle adhesive 1602, such as an acrylic resin or an epoxy resin that may be cured with ultraviolet light. The pellicle adhesive 1602 may also be a fluoropolymer adhesive. The pellicle adhesive 1602 covers a minimum of about 70% of the width 1630 of the frame 1600. When desired, such as to clean the active area 225 of the vented AltPSM 40, the pellicle 1700 may be removed, such as by mechanical or chemical means, from the frame 1600 and replaced.

The vent channels 232, 242 allow gaseous exchange 1900 between the pellicle cavity 1620 and the exterior 1720 of the pellicle 1700, as shown in an embodiment of the present invention in FIG. 5B. The gaseous exchange 1900 may include venting or purging, such as with clean dry air (CDA) or Nitrogen ($N_2$) gas. The gaseous exchange 1900 may occur statically, such as due to a pressure gradient or a temperature gradient, or dynamically, such as due to a forced gas flow. The gaseous exchange 1900 may be into or out of the pellicle cavity 1620.

If desired, the vent channels 232, 242 may allow trapping of particulate or chemical contamination (not shown), such as with a filter, a tacky strip, or a labyrinthine passageway. In an embodiment of the present invention, the vent channels 232, 242 may direct contamination away from the active area 225 and towards an adhesive coating on an inside surface of the frame 1600.

The vent channels 232, 242 also allow pressure equalization 1950 between the pellicle cavity 1620 and the exterior 1720 of the pellicle 1700. As desired, a pressure differential may be dissipated gradually or abruptly.

In other embodiments of the present invention, the structures, shapes, dimensions, and orientations, as well as the number, locations, and placement of the vent channels 232, 242 may vary, depending on various factors. One factor is the choice of operation in a laminar regime or a turbulent regime for the gaseous exchange 1900 during venting or purging. Another factor is the maximum expected pressure differential between the pellicle cavity 1620 and the outside 1720 of the pellicle due to climatic change, environmental change (in reticle stocker, imaging tool, or clean room), altitude change, venting, or purging.

Various embodiments of an apparatus for venting a pellicle cavity of a mask according to the present invention will be described next. As shown in a plane view of an embodiment of the present invention in FIG. 6, a vented mask 60 may include a square flat plate with dimensions of about 152.4 mm by about 152.4 mm and a thickness of about 6.35 mm with flatness of about 0.5–2.0 um. A front surface of the vented mask 60 includes an active area 225 that may include various features that may be non-phase-shifting or phase-shifting. The features may include optical proximity correction (OPC). In an embodiment of the present invention, the vented mask 60 is transmissive. The active area 225 of the transmissive mask may have features that include clear areas of fused silica or modified fused silica with an index of refraction of about 1.40–1.60 at the actinic wavelength and birefringence of about 0.25–20 nm/cm and opaque areas with an absorber layer.

Vent channels 232, 242 are located in a peripheral area 227 of the vented mask 60 around the active area 225. As shown in a plane view of an embodiment of the present invention in FIG. 6, the vent channel 232 may include a trench or a groove with a width 232W of about 500–2,000 um and a length 232L of about 2,500–6,000 um. In another embodiment of the present invention, the vent channels 232, 242 may include curves, such as "S"-shapes, or zig-zags, such as "Z"-shapes, along their lengths.

In an embodiment of the present invention, the sidewall of the vent channels 232, 242 is steep and smooth, with a slope of about 85–90 degrees, and the bottom of the vent channels 232, 242 is flat and smooth. In another embodiment of the present invention, the vent channels 232, 242 may include rounded bottoms, such as "U"-shaped cross-section, or notched bottoms, such as "V"-shaped cross-section, along the trench length 232L or the trench width 232W.

In an embodiment of the present invention, the trench depth is about 0.25–3 times the trench width 232W. In another embodiment of the present invention, the vent channels 232, 242 may have a trench depth of about 500–1,500 um.

A frame 1600 may be mounted with a frame adhesive to the front surface of the vented mask 60. Except where the frame 1600 traverses the vent channels 232, 242, the frame adhesive covers a minimum of about 70% of the width of the frame 1600.

The frame 1600 straddles the vent channels 232, 242 in the peripheral area 227 of the vented mask 60 around the active area 225. The vent channels 232, 242 are sufficiently wide, deep, and long so that the frame adhesive will not completely fill in the vent channels 232, 242 wherever the frame 1600 traverses over the vent channels 232, 242.

The frame adhesive may be a paste or a hot melt adhesive. The frame adhesive is resistant to radiation at the actinic wavelength and will not outgas or generate particles even when temperature is elevated during exposure to the radiation in an imaging tool.

The frame 1600 may be metal, ceramic, or plastic. In one embodiment of the present invention, the frame 1600 is rigid and has good thermal conductivity. In another embodiment of the present invention, the frame 1600 is anodized aluminum. As shown in an elevation view of an embodiment of the present invention in FIG. 5A, the frame 1600 has a height 1650 of about 2–6 mm and a width 1630 of about 2 mm.

In one embodiment of the present invention, the frame 1600 encloses a frame area 229 having a rectangular shape with a length of about 147–149 mm and a width of about 113–124 mm. The frame area 229 includes the active area 225, an inner portion 227A of the peripheral area 227, and a portion 227C of the peripheral area 227 covered by the frame 1600, but does not include an outer portion 227B of the peripheral area 227. The demarcation between the inner portion 227A and the outer portion 227B of the peripheral area 227 of the vented mask 60 is portion 227C which is determined by the placement and width of the frame 1600. In other embodiments of the present invention, the frame 1600 may enclose a frame area 229 with a shape that is essentially circular, polygonal, octagonal, square, or oval.

As shown in an elevation view of an embodiment of the present invention in FIGS. 5A–5B, a pellicle 1700 is attached to the frame 1600 to form a pellicle cavity 1620. The pellicle cavity 1620 includes the frame area 229. The frame area 229 includes the active area 225.

The pellicle 1700 is formed from a material that has a high transmittance of radiation at the actinic wavelength. A transmittance of about 98% or greater is desirable, but, for an actinic wavelength of 157 nm, a transmittance as low as about 80% may be adequate. The pellicle 1700 should have minimal absorption and minimal reflectance of radiation at the actinic wavelength. In an embodiment of the present invention, the pellicle 1700 may be coated with one or more layers of an anti-reflective coating (ARC) on one or both surfaces. The pellicle 1700 should not degrade even after prolonged or repeated exposure to radiation at the actinic wavelength.

In one embodiment of the present invention, the pellicle 1700 is a thin membrane or film that is stretched across the frame 1600. Suitable materials for forming the pellicle 1700 that is soft may include nitrocellulose or cellulose acetate for actinic wavelength of 436 nm or 365 nm, fluorocarbon polymer for actinic wavelength of 248 nm, or perfluorocarbon polymer for actinic wavelength of 193 nm. The pellicle 1700 that is soft may have a thickness of about 0.5–3.0 um with a flatness of 1 um or less. In an embodiment of the present invention, the soft pellicle may have a thickness of (0.7–0.8) +/−0.05 um.

In another embodiment of the present invention, the pellicle 1700 is a thin layer that is supported by the frame 1600. Suitable materials for forming the pellicle 1700 that is hard include modified fused silica for an actinic wavelength of 157 nm. Modified fused silica includes low-Hydroxyl-content fused silica and Fluorine-doped fused silica. The pellicle 1700 that is hard may have a thickness of about 500–1,100 um.

As shown in an embodiment of the present invention in FIG. 5B, the pellicle 1700 has a standoff distance 1750 above the surface of the active area 225 that depends on the height 1650 of the frame 1600. The standoff distance 1750 should be larger than the depth of focus for the exposure so that any contamination 1800 that may land on the pellicle 1700 will not print as a defect, as long as the lateral dimension 1830 of the contamination 1800 is smaller than a threshold dimension, such as 0.1 um.

The pellicle 1700 may be attached to the frame 1600 with a pellicle adhesive 1602, such as an acrylic resin or an epoxy resin that may be cured with ultraviolet light. The pellicle adhesive 1602 may also be a fluorocarbon polymer. The pellicle adhesive covers a minimum of about 70% of the width 1630 of the frame 1600. When desired, such as to clean the active area 225, the pellicle 1700 may be removed, such as by mechanical or chemical means, from the frame 1600 and replaced.

The vent channels 232, 242 allow gaseous exchange 1900 between the pellicle cavity 1620 and the exterior 1720 of the pellicle 1700, as shown in an embodiment of the present invention in FIG. 5B. The gaseous exchange 1900 may include venting or purging, such as with clean dry air (CDA) or Nitrogen ($N_2$) gas. The gaseous exchange 1900 may occur statically, such as due to a pressure gradient or a temperature gradient, or dynamically, such as due to a forced gas flow. The gaseous exchange 1900 may be into or out of the pellicle cavity 1620.

If desired, the vent channels 232, 242 may allow trapping of particulate or chemical contamination (not shown), such as with a filter, a tacky strip, or a labyrinthine passageway. In an embodiment of the present invention, the vent channels 232, 242 may direct contamination away from the active area 225 and towards an adhesive coating on an inside surface of the frame 1600.

The vent channels 232, 242 also allow pressure equalization 1950 between the pellicle cavity 1620 and the exterior 1720 of the pellicle 1700. As desired, a pressure differential may be dissipated gradually or abruptly.

In other embodiments of the present invention, the structures, shapes, dimensions, and orientations, as well as the number, locations, and placement of the vent channels 232, 242 may vary, depending on various factors. One factor is the choice of operation in a laminar regime or a turbulent regime for the gaseous exchange 1900 during venting or purging. Another factor is the maximum expected pressure differential between the pellicle cavity 1620 and the outside 1720 of the pellicle due to climatic change, environmental change (in a reticle stocker, an imaging tool, or a cleanroom), altitude change, venting, or purging.

In addition to the pellicle 1700 mounted to the frame 1600 on the front surface of the vented mask 60, it may be desired, especially in the case of a transmissive mask, to optionally mount another pellicle (not shown) to another frame (not shown) on the back surface of the vented mask 60.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of and an apparatus for venting a pellicle cavity of a mask.

I claim:

1. A mask comprising:
an active area; and
a peripheral area disposed around said active area, said peripheral area comprising vent channels in a substrate, said vent channels including S-shaped curves and V-shaped cross-sections along their lengths.

2. The mask of claim 1 wherein said mask further comprises a frame disposed over said peripheral area, said frame traversing over said vent channels, and a pellicle disposed over said frame.

3. The mask of claim 2 wherein said vent channels allow gaseous exchange.

4. The mask of claim 2 wherein said vent channels allow pressure equalization.

5. The mask of claim 1 wherein said vent channels comprise trenches or grooves.

6. The mask of claim 1 wherein said active area includes a non-phase-shifting opening.

7. The mask of claim 1 wherein said active area includes a phase-shifting opening.

8. An apparatus comprising:
a mask, said mask comprising:
a non-phase-shifting opening disposed over a front surface of said mask in an absorber layer,
a phase-shifting opening disposed over said front surface of said mask in said absorber layer and an underlying substrate; and
a vent channel disposed over said front surface of said mask in said absorber layer and said underlying substrate, said venu channel including an S-shaped curve and a V-shaped cross-section along its length;
a frame mounted to said front surface of said mask, said frame enclosing an area that includes said non-phase-shifting opening and said phase-shifting opening, said frame traversing over said vent channel; and
a pellicle attached to said frame.

9. The apparatus of claim 8 wherein said mask is transmissive.

10. The apparatus of claim 8 wherein said vent channel allows gaseous exchange.

11. The apparatus of claim 8 wherein said vent channel allows pressure equalization.

12. The apparatus of claim 8 wherein said vent channel comprises a trench or a groove.

13. The apparatus of claim 8 further comprising a second frame, said second frame mounted to a back surface of said mask, and a second pellicle attached to said second frame.

14. The apparatus of claim 8 wherein said pellicle comprises a hard pellicle.

15. A phase-shifting mask comprising:
an active area disposed over a front surface of said phase-shifting mask;
a peripheral area disposed around said active area; and
vent channels disposed in a portion of said peripheral area in a substrate, said vent channels including S-shaped curves and V-shaped cross-sections along their lengths.

16. The phase-shifting mask of claim 15 wherein said vent channels are disposed in an absorber layer and an underlying substrate.

17. The phase-shifting mask of claim 15 wherein said vent channels comprises a depth of 500–1,500 microns, a width of 500–2,000 microns, and a length of 2,500–6,000 microns.

18. The phase-shifting mask of claim 15 further comprising:
a frame disposed over said portion of said peripheral area, said frame traversing over said vent channels; and
ap pellicle disposed over said frame.

19. The phase-shifting mask of claim 15 further comprising:
a second frame, said second frame disposed over a back surface of said phase-shifting mask; and
a second pellicle disposed over said second frame.

* * * * *